Feb. 9, 1965 J. L. SORKIN ETAL 3,169,065
METHOD OF MAKING RESIST AND DEEP ETCH LITHOGRAPHIC PRINTING PLATES WITH FERRIC AMMONIUM COMPOUND SENSITIZED PLATES
Filed Oct. 11, 1960
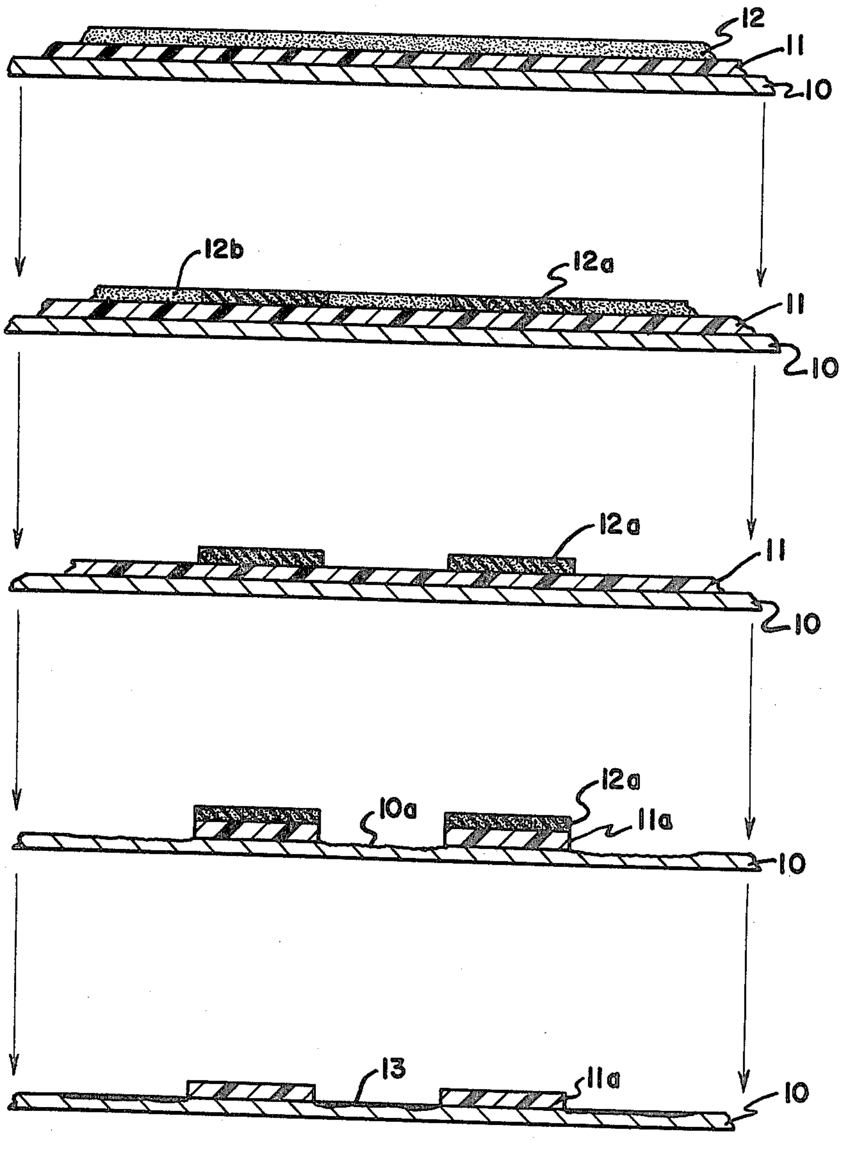
INVENTORS
JACK L. SORKIN &
DOLAR N. ADAMS
BY
Oberlin, Maky & Donnelly
ATTORNEYS 3,169,065

METHOD OF MAKING RESIST AND DEEP ETCH LITHOGRAPHIC PRINTING PLATES WITH FERRIC AMMONIUM COMPOUND SENSITIZED PLATES

Jack L. Sorkin and Dolor N. Adams, Cleveland Heights, Ohio, assignors to Harris-Intertype Corporation, Cleveland, Ohio, a corporation of Delaware Filed Oct. 11, 1960, Ser. No. 61,843
18 Claims. (Cl. 96—33)

The present invention relates to lithographic printing and, more particularly, to a presensitized plate that can be stored and subsequently developed, either to form a resist or, preferably, further processed by techniques involving an etchant to provide a deep etch lithographic printing plate, a relief letterpress printing plate, a name plate, or the like.

Some iron salts have been known to be photosensitive and to possess the ability to tan certain water-soluble resins such as gelatin. Other iron salts, such as ferric ammonium citrate, do not possess this tanning action. However, upon exposure to light a change occurs in such iron salts, and in its changed form, the salt possesses the ability to catalyze a reaction between water-soluble resins and an oxidizer, such as hydrogen peroxide. This last reaction results in insolubilization of the resin.

The tanning action of light-struck salts and an oxidizer has also been known and has been used in connection with gelatin as a basis for preparing silk screen stencils. However, when a combination of this type, is coated on metals, such as aluminum, copper, zinc, magnesium, or chromium, a reaction occurs between the metal and such a coating which quickly results in a loss of the ability to harden differentially the light exposed portions of the coating. For example, reaction with the metal often causes flaws such as pinholes or bubbles in the coating. Also, the adhesion of the coating to the metal may initially be poor and/or deteriorate in time with resultant peeling in the coating.

In applying a light-sensitive iron system to the preparation of a presensitized plate, we have found that interposing an intermediate or sub-layer between the metal surfaced plate and the light-sensitive iron system results in a materially improved presensitized plate, the photosensitivity of which is only slightly affected even after one year of storage.

In the making of a so-called "deep-etch" lithographic plate, it is known to carry out the steps of coating a metal sheet, such as aluminum or zinc, with a light-sensitive coat of, for example, gum arabic and ammonium bichromate, hardening the coat in selected areas by exposure to light, washing the plate with an aqueous developer to remove the unhardened coat from unexposed areas so as to uncover corresponding areas of the metal sheet, and applying an aqueous etching solution to the entire surface of the sheet to attack and remove metal to a desired extent from such uncovered areas, the hardened coat in the exposed areas acting as a resist to prevent attack of the metal by the etching solution in the latter areas. After etching, further known steps such as de-smutting of the etched metal, lacquering the etched areas and applying asphaltum and ink thereto to render such areas ink-receptive, and removing the hardened coat from the unetched areas, are customarily carried out to complete the preparation of the plate for printing. In such plates, the ink is carried by the lacquered etched areas of the plate.

Also it is known to follow a similar procedure in the making of etched relief printing plates, the etching being carried out to a greater depth sufficient to avoid contact with the inking rollers, the de-smutting and lacquering steps being omitted, and the hardened resist being removed or allowed to remain as desired. In such plates the ink is carried by the unetched areas of the plate. Furthermore, such processes may be utilized for other purposes such as the making of name plates, or various ornamental articles.

Various metals, etching solutions, and coatings may be employed, but in general these are closely interrelated. For example, the etchant must be one which will attack the selected metal in the desired manner and at the desired rate, and the light-sensitive coating must, after hardening, resist the action of the particular etchant and adhere firmly to the particular metal. Other necessary requirements such as light speed, adherence, and releasability of the unexposed coating must be met.

Heretofore it has been necessary to apply the light-sensitive coating forming the resist shortly prior to use, owing to deterioration upon storage. In accordance with the present invention a presensitized metal sheet is provided which is capable of storage for months without harmful deterioration and which then may be exposed, developed, and etched to form the desired end product. In its broad form the invention involves a light-sensitive layer or coat of the type employing the so-called Fenton's reaction (see Chemistry of Free Radicals by W. A. Waters, published by Oxford University Press, pages 247–252), a metal backing member, and a suitable protective or barrier material between the coat and the metal member effective to prevent reaction between them, the protective layer being penetrable by an aqueous etching solution for the metal of the plate, and the whole assembly being substantially stable and storable for months prior to use. In addition, the sub-layer must have the proper affinity for the metal on the one hand and the iron light-sensitive system on the other so as to provide an integral self-contained product having no tendency toward peeling while permitting ready release of the unhardened areas of the coat.

Finally, in making a deep-etch lithographic plate, where the light hardened resist is removed following the etching and lacquering steps to uncover the non-printing ink-rejecting areas of the plate, it is highly desirable that the sub-layer in such areas be hydrophilic rather than oleophilic so as to enhance rather than interfere with the ink-rejecting character of such areas.

It is, therefore, a principal object to provide an improved presensitized plate adapted for subsequent exposure and development.

Another object is to provide a metal surfaced presensitized plate having an iron salt-light-sensitive system protected against reaction with the metal surface.

A further object is to provide a presensitized plate especially adapted for processing into a deep-etch lithographic plate or a relief letterpress lithographic plate.

Other objects of the invention will become apparent as the description proceeds.

To the accomplishment of the foregoing and related ends, the invention consists of the features hereinafter fully described and particularly pointed out in the claims, the following disclosure describing in detail the invention, such disclosure illustrating, however, but one or more of the various ways in which the invention may be practiced.

The accompanying drawing illustrates five sequential steps or stages in the preparation of a deep-etch lithographic printing plate.

In accordance with the present invention, we coat the metal surfaced plate with a protective sub-layer and then apply over the sub-layer a further layer of a light-sensitive system comprising a water-soluble non-tanning ferric iron salt, which may but does not necessarily include an organic acid, and a water-soluble resin. Optionally, the light-sensitive system may also contain a coloring agent and/or one or more plasticizers. The assembly is then exposed to light through a transparency or stencil and subsequently dipped into an oxidizing solution for a sufficient time to permit the oxidizing agent to penetrate the entire thickness of the outer or light-sensitive coating. As a result, the water-soluble resin content in those portions of the outer layer which have been exposed to light is converted by the oxidizing agent to water-insoluble products, the conversion reaction being catalyzed by the iron salt in those portions. The solubility of the unexposed portions of the outer layer remains substantially unaffected. These unexposed portions or areas may be washed away by water to leave an image corresponding to the light-hardened areas occasioned by the transparency or stencil. At this juncture the product consists of a resist supported by the plate. Prior to the preparation of such resist, the described underlying sub-layer protects the iron-containing light-sensitive system from destruction by reaction with the metal surface. The resist may be used in this form, or it may be subjected to further treatment in a manner known in the art, for example, to harden additionally the resist surface.

If it is desired to produce a deep etch lithographic printing plate, the plate bearing resist formed as just described is further treated with an etchant. For this purpose, it will be apparent that the etchant must penetrate those portions of the sub-layer left exposed between the resist areas, and the etchant must also "lift" such sub-layer or otherwise effect its removal from the plate. In so doing the etchant reaches the metal surface and chemically attacks it in those portions defined by the areas which were not light-struck. Thereafter the plate may be treated in a standard manner to produce a deep etch plate. For example, the plate may next, in turn, be washed, desmutted, lacquered, coated with asphaltum, inked, and the resist removed.

At such time, after the balance of the resist has been removed, those immediately underlying areas comprise the portions of the sub-layer not previously removed or "lifted" by the etchant. Accordingly, the hydrophilic character of such a sub-layer becomes an important attribute, since it is precisely these same areas of the sub-layer which now form the non-printing, oleophobic areas of the plate. Such non-printing areas may be treated, if desired, with known lithographic plate desensitizers to increase further their hydrophilic character.

Plates processed from blanks prepared in this manner may be truly said to be "presensitized" deep etch plates. That is, a blank from which the deep etch plate is made may be used immediately or stored for months with no deterioration prior to actual use.

Metal surfaces which may be used in preparing resists on lithographic plates in accordance with the present invention include aluminum, zinc, copper, magnesium and chromium. Aluminum and zinc are preferred. When zinc is to form the plate, it is recommended that the zinc be treated with oxalic acid prior to deposition of the sub-layer. Apparently, an undercoat of zinc oxalate forms which produces enhanced benefits.

We have found that a variety of hydrophilic, organic and inorganic resinous materials, either of synthetic or natural origin, capable of jointly adhering to both a layer of the light-sensitive system and to the metal plate while protecting the layer and plate from contact with each other and penetrable by an aqueous etchant for the particular metal employed, are suitable for the purpose of forming the sub-layer. Among such materials from which the sub-layer may be formed are the following. Combinations of these layers may also be used.

(1) Gelatin.

(2) Polyacrylic acid, polymethacrylic acid, and water-soluble salts thereof such as the ammonium, potassium and sodium salts, as well as the amides such as polyacrylamide, and also the monomer of such acids, for example, acrylic acid polymerized in situ.

(3) Carboxymethyl cellulose and carboxymethyl hydroxyethyl cellulose.

(4) A titanate.

(5) Modified urea-formaldehyde and melamine-formaldehyde resins.

(6) Modified urea-formaldehyde and melamine-formaldehyde resins treated with a water-dispersible member of the class consisting of polycarboxy compounds, combined polyhydroxy polycarboxy compounds, and alkali metal silicates such as sodium, potassium, and lithium silicates, and water-soluble fluo-silicates.

(7) Polyvinyl alcohol.

(8) Ferrocyanides, such as sodium, potassium or ammonium ferrocyanide, (9) Bichromates, such as sodium, potassium or ammonium bichromate.

(10) Inorganic layer of the oxide of the metal forming the plate.

More particularly, the members listed as numbers 1, 2, 3, 7, 8, and 9 may be applied over the metal surface from an aqueous dispersion or solution and then allowed to dry to deposit the sub-layer. A sufficient amount should be applied to cover completely the metal surface and provide a necessary thickness. Thus, the concentration of the sub-layer in the aqueous medium may range from about 0.1 to about 15 percent by weight or higher. Examples of alkali metal silicates which may be used are disclosed in U.S. Patent No. 2,507,314 which is hereby incorporated by reference.

When the sub-layer is to comprise a titanate, the material can be applied to a lithographic plate in the form of the compound:

$$R_4TiO_4$$

wherein R is a monovalent hydrocarbon radical of about one to about four carbon atoms. Such compounds are commonly referred to as titanium ortho esters and also as alcoholates. The monovalent hydrocarbon radical may be saturated or unsaturated and, accordingly, may be an alkyl group such as methyl, ethyl, propyl, isopropyl, butyl, and isobutyl; or an alkylene group such as ethylene, propylene, isopropylene, butylene, and isobutylene. The compound tetraisopropyl titanate has been found to be particularly useful and is preferred of this class of materials.

The manner of preparing these titanium esters is known in the art. Reference is made, for example, to United States Patents Nos. 2,187,821 and 2,732,799 the disclosures of which are hereby incorporated by reference. As described in the former patent, one method of preparation comprises reacting an alcohol with a halide, preferably the chloride, of titanium in the presence of ammonia.

These sub-layers are applied to a plate in any convenient solvent, and for this purpose organic solvents are particularly useful. It will be appreciated that the organic solvents play no critical part in practicing the invention and therefore can vary widely in nature. Aromatic solvents such as benzene, toluene, and xylene may be used; also solvents such as acetone and the chlorinated hydrocarbons may be employed. But a preferred solvent comprises the humectants or hygroscopic solvents for a reason hereinafter noted. The humectant solvents include, for example, the anhydrous or substantially anhydrous alcohols, such as methyl, ethyl, propyl, isopropyl, butyl, and isobutyl alcohols, ethylene glycol, diethylene glycol, glycerol, Cellosolve, Cellosolve acetate, Cellosolve butylate, methy Cellosolve, butyl Cellosolve, Carbitol, butyl Carbitol, and the like. The content of the titanium ester in a solvent is not critical, since repeated applications and dryings may be made if necessary until a coat of desired thickness is deposited. However, single applications of a solvent containing about 0.1 percent to about 10.0 percent have been successively used. A concentration of about one percent of the titanium ester in a solvent is the normal practice.

Thus in accordance with the present invention, it is possible to form a sub-layer or sub-base on a lithographic plate by dipping the plate in a solvent of the metal ester or alcoholate and then removing the plate and drying. The layer of metal ester so deposited hydrolyzes rapidly on exposure to air. The mechanism is thought to involve the formation of an intermediate complex between the ester and water. The hydroxy ester cannot be isolated since it immediately reacts to give a dimer. The hydrolysis proceeds in a stepwise fashion until a clear amorphous film of the oxide is deposited.

In view of the hydrolysis of the titanium ester as just described, it has been found advantageous to use a solvent which is also a humectant, that is, one that is sufficiently hygroscopic to absorb moisture from an ambient atmosphere. This action supplies a ready source of water for the hydrolysis reaction and literally "boosts" the hydrolysis to a desired completion. When the solvent employed is not a humectant, as in the case of toluene, the solvent must first be substantially removed after deposition on a plate before the hydrolysis of the titanium ester can take place, thus unnecessarily prolonging the time for deposition of the titanium oxide.

However, the preferred sub-layer materials are the fifth and sixth members of the foregoing list. These materials may be any of four different types of resins or a mixture thereof. One such resin is an alkylated methylol melamine resin produced as described in the U.S. Patent No. 2,715,619. The disclosure of this reference is incorporated herein by reference. In general, the process described in this patent comprises the following steps: (A) reaction of melamine with formaldehyde in a mixture containing controlled amounts of etherifying alcohol and water under alkaline conditions, (B) alkylation under acid conditions, with additional alcohol, if necessary, and (C) concentration of the neutralized syrup to remove the excess and unreacted alcohol.

Another resin that may be used on the base member is a polyalkylenepolyamine-melamine-formaldehyde resin produced as disclosed in U.S. Patent 2,796,362. The disclosure of this patent is also included herein by reference. The resins useful herein are characterized by content of at least five and preferably more than six mols of combined formaldehyde per mol of melamine with the number of nitrogen atoms in the polyalkylenepolyamine per mol of melamine being between 0.5 and 10.0 and the resin being cationic.

Another aldehyde resin that may be used in this process is the amine modified urea-formaldehyde resin disclosed in U.S. Patent 2,554,475. The disclosure of this patent is also included herein by reference.

These resins are infinitely water-dilutable polyfunctional compounds in which the polyfunctional amine contains at least two functional amino groups and are prepared generally by reacting a polyfunctional amine or salt thereof with urea and formaldehyde or with the condensation product of urea and formaldehyde at a pH and temperature such that there is no viscosity increase, followed by aging at a pH and temperature such that the viscosity increases steadily at a controllable rate.

In a preferred process the urea and an aqueous solution of formaldehyde is reacted at from about 70–80° C. for about 15–30 minutes under alkaline conditions with the mol ratio of urea to formaldehyde being about 1:2–1:2.8 followed by adding thereto about 2–8 percent of a polyfunctional amine based on the weight of urea, adjusting the pH to between 1 and 4 and reacting by heating at a temperature of from about 68° C. to reflux temperature for about 15–180 minutes followed by reducing the temperature to one between about room temperature and 55° C.

Another resin that may be used is an alkali metal sulfurous acid salt modified urea-formaldehyde resin produced as described in U.S. Patent 2,559,578 which disclosure is included herein by reference.

These resins are preferably applied to the clean base member in an aqueous dispersion and then the excess is rinsed off after a preferably relatively short interval of time with running water which may be tap water. In the preferred process the resin is employed in an aqueous dispersion containing about 0.1 to 20.0 percent of the resin by weight and the base member is treated with this solution for a brief time, preferably from about 10 seconds to 5 minutes. The temperature of the dispersion is lower than the boiling point of water and for commercially satisfactory reasons is preferably from about room temperature to 185° F.

After application of the resin dispersion to the base member it is rinsed with water, preferably running water, which may be tap water. The plate is now dried to deposit a sub-layer of the resin and to insolubilize it on the metal surface. If desired, heating may be used to facilitate drying.

In a preferred form of this type of sub-layer, the resin coat is subjected to a further coating prior to drying. This further coating can be provided by an aqueous dispersion of either a polycarboxy compound, a combined polyhydroxypolycarboxy compound, an alkali metal silicate, water-soluble fluo-silicates, and the like. Among the many compounds that may be used are: polyhydroxylic acids such as gluconic acid, polyvinyl pyrrolidone, polyvinyl pyrrolidone-vinyl acetate copolymer, carboxymethyl cellulose, carboxymethyl-hydroxyethyl cellulose and the salts thereof, guar gum which is a polysaccharide, polyacrylamide, polyacrylic acid, alkali metal silicates such as sodium, potassium, or lithium silicate, gelatin, carboxypolymethylene, and styrene-maleic acid copolymer.

Where the compound is either a silicate-containing compound or a polyhydroxy compound, the aqueous dispersion preferably contains up to about 1 percent by weight of compound. Where the compound is a polycarboxy compound such as a polycarboxylic acid or a combined polyhydroxy-polycarboxy acid compound the amount is preferably up to about 10 percent by weight. The above coating material is preferably applied in aqueous dispersion of a concentration of about 0.0035–10.0 percent of the material in water and at a preferred temperature between room temperature and 185° F. The application of the water dispersion compound may be as rapidly as practicable with a time between 5 seconds and 10 minutes being found most desirable for common commercial practice. As soon as the aqueous dispersion has been applied, the plate is again rinsed with water that may be tap water.

Again the plate with such dual coats is dried with or without the use of heat. However, it is possible to insolubilize such contiguous coats in the following manner.

As soon as the base member containing the first above defined coating is coated with the second coating it is contacted with a third material which is an aqueous solution of a water soluble compound of a metal of Group IV–B of the Periodic Table. Thus the metals include zirconium, hafnium, titanium and thorium, with zirconium and hafnium being preferred. The metal compound is preferably a salt with the acid radical of the salt being any that will make the compound water soluble and that will not react with the base member of the previously applied coating thereon or with the subsequently applied sensitizer or light sensitive material. Typical salt groups are the acetates, nitrates and sulfates and these are relatively inexpensive and easy to obtain. Other salts may be used of course subject to the foregoing qualifications. The metal compound solution preferably has a concentration of 0.01–10.0 percent by weight and is preferably applied at a temperature of from room temperature to about 185° F. In each of the treating baths the upper limit of 185° F. is merely a practical upper limit as any temperature may be used below the boiling point of water. The treatment with the metal salt solution may be as rapidly as practical and in commercial instances has been found to be between 5 seconds and 10 minutes.

After application of the metal salt solution the plate is again rinsed off with water, preferably running water such as tap water.

The metal compounds of Group IV–B of the Periodic Table used in this invention appear to act as agents in curing the two previously applied coatings. Although the exact nature of the action has not been proven chemically it appears that each of the three coatings appear to interact to form a single layer that is adherent to both the base member and to the light exposed sensitizer. The first coating is of course the aldehyde condensation product resin compound and the second coating is the polycarboxy or polyhydroxy polycarboxy compound or the mentioned alkali silicates or fluo-silicates.

Considering now the indicated tenth class of materials which may be used to form the sub-layer, these materials may comprise a layer of the oxide of the metal which defines the surface of the lithographic plate. Aluminum is particularly well adapted for this treatment. In general, to prepare this type of inorganic sub-layer any treatment which provides a strong chemical oxidation of the metal may be used. These oxide coatings are more than a superficial oxide layer which may form when the metal is in normal contact with air. The oxide coatings contemplated are relatively thicker, and afford more protection to the metal, than such normally occurring metal oxide layers. Relatively thick oxide layers of the type herein contemplated may be produced by the techniques disclosed in United States Patents No. 2,118,053 and No. 2,504,434 which are hereby incorporated by reference.

Referring now to the light-sensitive system which may be applied over the described sub-layer materials, the light-sensitive iron salt should be in the ferric state. We prefer to use ferric ammonium citrate, although ferric ammonium oxalate, ferric ammonium tartrate and such compounds having an alkyl-substituted ammonium group may also be used. Among the latter are ferric methylamine citrate, ferric ethylamine oxalate or tartrate, and the like. The organic acids found to be effective include citric acid, oxalic acid, tartaric acid, and in general include any polycarboxylic acid having the required water-solubility. These organic acids are used to provide an acid pH, preferably a pH of about 2 to about 4, at which Fenton's reaction is most effective. If desired, the organic acid may be omitted from the light-sensitive system and admixed instead with the peroxide solution. As indicated, the organic acid need be present for this purpose only when the peroxide reacts.

The water-soluble resin which may be employed includes, for example, gelatin, polyvinyl alcohol, and polyvinyl methylether-maleic anhydride copolymer, and mixtures thereof.

To delineate better a pattern obtained in accordance with our invention, a coloring agent may be included in the coating formulation. This may be either a pigment or a dye provided the material chosen is compatible with the remaining constituents and provided the coloring material is one which does not interfere with the penetration of the light into such coating.

After the iron light-sensitive coating mixture has been prepared, it may be applied over a sub-layer by any of the usual techniques, for example, as by whirling, dipping, or roller coating the plate. Once a uniform coating is obtained, it is allowed to dry on the plate. The dry plate may be stored for an indefinite period without any substantial deterioration, because the constituents of the coating do not react appreciably until activated by light and subsequent treatment with an oxidizer, as previously mentioned.

The oxidizer employed is preferably a water-soluble peroxide such as hydrogen peroxide. The concentration of the oxidizer is not critical and may vary from 0.3 percent to 6 percent by weight aqueous solution, the smaller amounts being used for a light-sensitive system comprising polyvinyl alcohol. Other oxidizers which may be used include urea-peroxide, ammonium persulfate, and sodium perborate, concentrations being such as to provide an amount of oxygen substantially equal to that provided by hydrogen peroxide. If the resist is to be further hardened, conventional hardening agents such as tannic acid, formaldehyde, and a tannic acid-glyoxal mixture may be used.

Etchants which may be used include aqueous solutions of ferric chloride, platinum or palladium catalyst etch, zinc etch, chromium etch, and the like. Preferably, if a non-iron etch is employed, a hardener as described should be used. Those etchants which are particularly adaptable for certain metals, such as zinc and aluminum, are well known in the art. For example, the following may be used:

*Zinc Deep-etching solution*

| | | Metric units |
|---|---|---|
| Calcium chloride solution, 40–41° Bé. | cc | 1000 |
| Iron perchloride, lumps | g | 25 |
| Hydrochloric acid, C.P., 37–38.5% | cc | 20 |

The finished deep-etching solution should test 40–41° Baumé at 77° F.

*Aluminum deep-etching solution*

| | | Metric units |
|---|---|---|
| Calcium chloride solution, 40–41° Bé. | cc | 1000 |
| Zinc chloride, technical | g | 380 |
| Iron perchloride solution, 50–51° Bé. | cc | 285 |
| Hydrochloric acid, 37–38.5% | cc | 114 |
| Cupric chloride ($CuCl_2 \cdot 2H_2O$) | g | 27 |

The finished solution should have a density of 50–52° Baumé at 77° F.

The 50–51° Baumé iron perchloride solution may be formulated as follows:

| | | Metric units |
|---|---|---|
| Iron perchloride ($FeCl_3$), lumps technical anhydrous | g | 1080 |
| Water | cc | 1000 |

*Dowetch solution*

| | | Metric units |
|---|---|---|
| Nitric acid, 70% | cc | 48 |
| Dioctyl sodium sulfosuccinate, 75% | g | 2.8 |
| Diethyl benzene | cc | 12 |
| Sodium sulfate | g | 0.12 |
| Water | cc | 336 |

In addition for either zinc or aluminum, a platinum catalyst etch may be used that is described in U.S. Patent No. 2,585,864 which is hereby incorporated by reference.

To remove the resist from its support, it is necessary only to soak the resist in a softening agent such as dilute sodium hypochlorite and thereafter sponge, brush, or rub off the softened coating. Or the resist may be removed simply by brush and water.

In the accompanying figure illustrating five successive stages, and in which relative thicknesses have been exaggerated for purposes of illustration, a blank (stage 1) consists of a sheet of metal 10 having a sub-layer as described 11 and an overlying layer 12 of the present light-sensitive system. After selectively exposing the blank to light through a transparency, stencil, or the like and treating the exposed blank with an oxidizing agent, as previously described, the exposed areas of the layer are insolubilized as at the areas 12*a* (stage 2). The unexposed areas or portions 12*b* are washed away by development. At this juncture the product consists of a resist supported by the sub-layer 11 and plate 10 (stage 3). If it is desired to produce a deep etch plate, the plate bearing the resist formed as just described is treated with an etchant. The etchant must penetrate those portions of the sub-layer 11 left between the resist areas, and the etchant must also "lift" the sub-layer or otherwise effect its removal from the plate. In so doing the etchant reaches the metal surface 10 and chemically attacks it resulting in those portions indicated at 10*a* (stage 4). Thereafter, the plate may next in turn be washed, desmutted, lacquered, coated with asphalt, inked to form printing areas 13, and the resist removed (stage 4).

In order to demonstrate the invention, the following examples are set forth for the purpose of illustration only. Any specific enumeration or detail mentioned should not be interpreted as a limitation of the invention unless specified as such in one or more of the appended claims and then only is such claim or claims. Diethylene glycol and glycerine which are mentioned in these examples, are not absolutely essential but are desirable as plasticizers and adhesion promoting agents and also as humectants.

*Example I*

A chemically cleaned and grained aluminum plate was dipped into a 5 percent aqueous solution of polyacrylic acid, drained, rinsed, and baked for about 5 minutes at 150° C. The plate was then coated on a whirler with the following solution and dried:

| | Grams |
|---|---|
| Gelatin | 16 |
| Ferric ammonium citrate | 7 |
| Citric acid | 2.5 |
| Diethylene glycol | 2 |
| Glycerine | 3 |
| Die (Monastral Blue) | 0.5 |
| Water | 175 |

The resulting lithographic "blank" or plate was exposed to ultra-violet light (3,000 foot candles carbon arc for 2 minutes) through a positive, dipped for 1 minute into a 4 percent hydrogen peroxide solution, and then washed with warm water. The unexposed portions of the gelatin-ferric ammonium citrate coating washed off leaving an image composed of the light-exposed portions. If further hardening of the resulting resist is desired it may be treated with a hardening solution such as a solution of tannic acid.

However, in this instance, following the washing away of the unexposed portions or areas, the exposed portions were dried and the plate treated with a ferric chloride etching solution. The exposed portions resisted this etch. Only where the unexposed gelatin-ferric ammonium citrate layer had washed away was the polyacrylic acid sub-layer penetrated, lifted, and the aluminum etched. This etched plate was then further treated by standard techniques to form a deep etch printing plate.

*Example II*

A process was carried out similar to the process of Example I except that gelatin was used as the sub-layer, ureaperoxide was the oxidizer, and the light-sensitive coating solution contained:

| | Grams |
|---|---|
| Gelatin | 32 |
| Ferric ammonium oxalate | 14 |
| Oxalic acid | 5 |
| Diethylene glycol | 4 |
| Glycerine | 2 |
| Dye | 6 |
| Water | 500 |

*Example III*

A sheet of aluminum was cleaned by washing for three minutes at 145° F. in a 10 percent aqueous solution of anhydrous trisodium phosphate. The sheet was then rinsed with a spray of tap water for three minutes. It was then desmutted by immersion in a bath of 2 percent chromic acid and 0.8 percent sulfuric acid in water for three minutes at room temperature. At the end of this time the sheet was rinsed for three minutes in a spray of tap water. The sheet was then immersed for two minutes in a 3 percent aqueous dispersion of resin prepared as described in Patent 2,796,362. The plate was again rinsed in tap water.

At this point the resin could have been insolubilized on the aluminum sheet by heating the sheet further to polymerize. However, proceeding in the preferred manner, the plate was next immersed for about 3 minutes in a 0.7 percent aqueous solution of carboxymethyl cellulose containing 2 percent of gluconic acid. The plate was then removed and rinsed with a tap water spray.

Again the two contiguous layers of resin and carboxymethyl cellulose could have been insolubilized on the aluminum sheet by heating the assembly. But in this instance, the plate was then immersed in a 1 percent solution of zirconium acetate salt and the treated sheet was again rinsed in tap water and dried. Next the plate was dipped in a solution of:

| | Grams |
|---|---|
| Polyvinyl alcohol (10% acqueous solution) | 110 |
| Ferric ammonium oxalate | 5 |
| Citric acid | 5 |
| Dye (Monastral Blue) | 0.5 |
| Water | 100 |

Following this the blank or plate was exposed to light and processed to a deep etch plate as in Example I, a 0.3 percent aqueous solution of hydrogen peroxide and chromium etch being used as the oxidizer and etch, respectively.

*Example IV*

A process was carried out like the process of Example 1 of Patent 2,559,578, and a 2 percent aqueous dispersion of sodium silicate and 0.25 percent aqueous solution of gluconic acid were substituted for the carboxymethyl cellulose-gluconic acid solution. The oxidizer was sodium perborate.

*Example V*

An aluminum sheet is etched for about five minutes at 90° C. in an aqueous bath having the following composition:

| | Percent |
|---|---|
| NaF | 2.0 |
| $NaAlO_2$ | 0.04 |
| NaOH | 0.15 |

After rinsing, the plate is defilmed for about three minutes at 80° C. in a bath having the following composition:

| | Percent |
|---|---|
| $HNO_3$ | 10.0 |
| $CrO_3$ | 1.0 |

The plate is again rinsed and then dried under infrared lamps after which the plate is dipped into a one percent isopropanol solution of tetraisopropyl titanate. The solution is maintained at room temperature and the plate remains immersed for about five minutes. The plate is once more dried under infrared lamps.

Following the drying, the plate was coated with the following solution and whirled dry:

| | Grams |
|---|---|
| Gelatin | 32 |
| Ferric ammonium tartrate | 14 |
| Tartaric acid | 5 |
| Glycerine | 2 |
| Dye (Monastral Blue) | 6 |
| Water | 500 |

Further processing was carried out as in Example I except that the oxidizer employed was 11 percent urea peroxide.

*Example VI*

A procedure was carried out like the procedure of Example V except that the sub-layer was carboxymethyl cellulose. This sub-layer also can be insolubilized by a treatment with a water-soluble salt of a metal of Group IV-B of the Periodic Table, as previously described, instead of heating.

*Example VII*

A zinc plate was brushed with pumice and then rinsed with water. The plate was then dipped for five minutes in 2.5 percent aqueous solution of potassium ferrocyanide and again rinsed and then dried under infrared lamps. A photosensitive coating was applied over the zinc plate prepared as described, such coating having this composition:

| | | |
|---|---|---|
| Gelatin | grams | 8 |
| Water | cc | 80 |
| Ferric ammonium oxalate | grams | 3.5 |
| Diethylene glycol | do | 1 |
| Glycerine | do | 0.5 |
| Butadiene acrylonitrile elastomer (Hycar 1552), 52% water dispersion | cc | 8 |

The blank as thus prepared was then exposed through a stencil or negative for five minutes at 3,000 foot candles. The exposure was developed for one minute in a solution having this composition:

| | | |
|---|---|---|
| Hydrogen peroxide (35% solution) | cc | 40 |
| Water | cc | 310 |
| Citric acid | grams | 4 |

The unexposed portions were washed off with water and the resulting resist then hardened by first dipping for one minute in a solution consisting of 50 cc. of Logwood Extract (a dye and tanning agent) and 50 cc. of water. The plate was next dipped for three minutes in a 3 percent aqueous solution of ammonium bichromate having a pH of about 2.8. Following this the assembly was rinsed in water and baked for five minutes at 450° F. The plate was then etched in Dowetch solution. This made a relief (letterpress) printing plate.

*Example VIII*

A zinc plate was brushed with pumice and then rinsed. The plate was dipped for five minutes in a five percent aqueous solution of oxalic acid followed by an additional rinse after which the plate was dipped for two minutes in a one percent aqueous solution of a polyalkylene-polyamine-melamine-formaldehyde resin produced as disclosed in U.S. Patent No. 2,796,362. The plate was again rinsed and then dried under infrared lamps. A further dip in a one percent non-aqueous solution of tetraisopropyl titanate was then made after which the plate was again dried under infrared lamps. A photosensitive coating was then applied to the plate having this composition:

| | | |
|---|---|---|
| Gelatin | g | 16 |
| Monastral Blue | g | 3 |
| Ferric ammonium oxalate | g | 7 |
| Citric acid | g | 2.5 |
| Diethylene glycol | g | 2 |
| Glycerine | g | 1 |
| $H_2O$ | cc | 250 |

A resist was made from the blank prepared as described by exposing the letter through a stencil for five minutes at 3,000 foot candles. The plate was then developed by a one minute dip in a four percent solution of hydrogen peroxide after which the unexposed portions were washed out with water. To harden the resist, the plate was dipped in a solution consisting of 10 cc. of a stearatochromic chloride (Du Pont's Quilon) and 240 cc. of water. The plate was again dried by infrared lamps.

To make a deep etch plate, the plate was then etched between the resist areas with a zinc etch and then rinsed with ethyl alcohol. A deep etch lacquer and an asphaltum were then applied in a conventional manner and a standard deep etch developing ink next applied. Following this the resist was removed and the background desensitized.

*Example IX*

A further zinc surfaced plate was dipped for 30 seconds in a solution comprising 340 grams of ammonium bichromate, 60 cc. of sulfuric acid (specific gravity 1.84) and 19 liters of water. The plate was then rinsed with water and dried under infrared lamps, after which the plate was dipped for one minute in a one percent aqueous solution of polyvinyl alcohol. The plate was again rinsed and infrared-dried.

A photosensitive coating was applied to the prepared plate as by whirling, the coating comprising:

| | | |
|---|---|---|
| Polyvinyl alcohol (10.7 aqueous solution) | cc | 100 |
| Ferric ammonium oxalate | g | 5 |
| Citric acid | g | 5 |
| Water | cc | 10 |

A resist was produced by exposing the blank prepared as described for five minutes at 3,000 foot candles. The exposed blank was then developed for one minute in a 0.3 percent hydrogen peroxide solution and the unexposed portions washed off as before.

To harden the resist thus formed, the plate was dipped for two minutes in a two percent solution of Logwood dye followed by a dip for three minutes in a 1.25 percent aqueous solution of chromic acid having a pH of about 2.8. The plate was then rinsed and baked for five minutes at 450° F. Dowetch solution was then applied to the plate to etch the exposed zinc metal. The result was a shallow relief letterpress plate.

*Example X*

A zinc surfaced plate was dipped for five minutes in the following solution:

| | | |
|---|---|---|
| Oxalic acid | g | 5 |
| Polyacrylic acid | g | 20 |
| Water | cc | 185 |

The plate was rinsed, baked for three minutes at 150° C., and then dipped in a one percent non-aqueous solution of a tetraisopropyl titanate. The plate was then dried under infrared lamps.

A photosensitive coating was then applied to the plate having this composition:

| | | |
|---|---|---|
| Polyvinyl alcohol | grams | 270 |
| Rhodamine B (an organic dye) | do | 2.7 |
| Ferric ammonium oxalate | do | 5 |
| Citric acid | do | 5 |
| Water | cc | 3100 |

The blank so prepared was exposed through a negative or transparency for five minutes at 3000 foot candles and then developed for one minute in a 0.3 percent hydrogen peroxide solution. The unexposed portions were washed off and the plate dried as before.

To prepare a deep etch plate, the resist was then etched with zinc etch followed by a rinse with alcohol. After drying the plate was then treated successively with a deep etch lacquer, asphaltum, and a deep etch developing ink. The resist was then removed by brushing with water and the background previously covered by the resist was then further desensitized. Gum and asphaltum were next applied to the deep etch plate in accordance with standard techniques.

*Example XI*

A further zinc plate was cleaned with pumice and rinsed. The plate was then dipped for 30 seconds in the following solution:

| | | |
|---|---|---|
| Ammonium bichromate | grams | 340 |
| $H_2O$ | liters | 19 |
| Sulfuric acid (sp. gr. 1.84) | cc | 60 |

After rinsing the plate was again dipped, this time in a one percent aqueous solution of polyvinyl alcohol and then rinsed.

A photosensitive coating was applied to the plate having this composition:

| | | |
|---|---|---|
| Gelatin | g | 8 |
| $H_2O$ | cc | 75 |
| Ferric ammonium oxalate | g | 3.5 |
| Diethylene glycol | g | 1 |
| Glycerine | g | 0.5 |
| Monastral Blue | g | 0.25 |

To prepare the resist, the blank prepared as described was exposed through a negative or transparency for five minutes at 3000 foot candles. The plate was then developed by a one minute treatment with the following solution:

| | | |
|---|---|---|
| Hydrogen peroxide (35%) | cc | 40 |
| Citric acid | g | 4 |
| Water | cc | 310 |

The unexposed portions were washed off as before and the resulting resist hardened by a two minute dip in a two percent aqueous solution of chromic acid. The resist was then baked for five minutes at 450° F. after which the plate was etched with Dowetch solution to prepare a letterpress plate.

*Example XII*

A sheet of magnesium was brushed with pumice and then rinsed. The sheet was then dipped for three minutes in the following solution:

| | | |
|---|---|---|
| Sodium bichromate | oz | 24 |
| Nitric acid (specific gravity 1.42) | fluid oz | 24 |
| Water | gal | 1 |

After rinsing the plate was coated wth this photosensitive coating.

| | | |
|---|---|---|
| Polyvinyl alcohol (10% solution) | g | 55 |
| Ferric ammonium oxalate | g | 2.5 |
| Water | cc | 50 |

In preparing the resist, the blank was exposed through a negative for five minutes at 3000 foot candles, developed for one minute in a 0.3 percent solution of hydrogen peroxide after which the unexposed portions were washed off. The plate was then dipped for one minute in a five percent solution of Logwood dye, and this was followed by another dip for three minutes in a 1.25 percent solution of chromic acid having a pH of about 2.5.

The plate was then rinsed and baked for five minutes at 450° F., followed by an etching treatment by Dowetch solution. It will be noted that no acid was used in this example in either the developer or the coating. The result was a letterpress printing plate.

*Example XIII*

A copper sheet was cleaned with benzene and then rinsed successively with acetone and water. The sheet was then dipped for one minute in a five percent aqueous solution of polyacrylic acid. After rinsing and drying under infrared lamps, the plate was dipped in a one percent non-aqueous solution of tetraisopropyl titanate. The plate was then again dried under infrared lamps. This produced a sub-layer on the copper sheet.

The copper sheet was then coated with a photosensitive coating having this composition:

| | | |
|---|---|---|
| Gelatin | g | 16 |
| $H_2O$ | cc | 205 |
| Ferric ammonium citrate | g | 7 |
| Diethylene glycol | g | 2 |
| Glycerine | g | 1 |
| Monastral Blue | g | 3 |
| Citric acid | g | 2.5 |

To prepare the resist, the blank was exposed for five minutes through a stencil at 3000 foot candles, developed by a one minute dip in a four percent solution of hydrogen peroxide, after which the unexposed portions were washed away with water and the plate then dried. The plate was then etched with a 42° Bé. ferric chloride. This produced a printed circuit on the copper sheet.

*Example XIV*

An aluminum surface was provided with a sub-layer comprising a chemically-induced relatively thick oxide layer in the following manner. An aluminum sheet was first cleaned by immersing the sheet in a 20 percent aqueous solution of trisodium phosphate for three minutes at a temperature of approximately 160° F. The sheet was then rinsed in water and desmutted by immersion in 70 percent aqueous nitric acid solution for two minutes at room temperature. Following a water rinse, the aluminum sheet was then immersed in a bath which chemically formed the aluminum oxide coating. This bath comprised an aqueous solution of 0.5 percent $NaAlO_2$ and 1.0 percent $Na_2C_2O_4$. The bath was maintained at a temperature within the range of about 190° F. to 203° F. and the immersion lasted for approximately three minutes. After this treatment, the plate was rinsed with water. The plate was then immersed for two minutes in a 3 percent aqueous dispersion of a resin prepared as described in Patent No. 2,796,362. The plate was again rinsed in tap water and processed further at this point in accordance with Example III.

*Example XV*

An aluminum sheet was again cleaned by the cleaning, desmutting, and rinsing steps set forth in Example XIV. The sheet was then chemically oxidized by immersing the sheet for approximately 20 minutes in an oxidizing bath maintained at approximately 187° F. to 193° F. This bath comprised an aqueous solution containing 2 percent $Na_2CO_3$ and 0.1 percent $K_2Cr_2O_7$. The plate was then rinsed with water, dried and then dipped into a 1 percent isopropanol solution of tetraisopropyl titanate. The plate was then further processed at this point in accordance with Example V.

Other forms embodying the features of the invention may be employed, change being made as regards the features herein disclosed, provided those stated by any of the following claims or the equivalent of such features be employed.

We therefore particularly point out and distinctly claim as our invention:

1. In a method of preparing a metal-surfaced printing plate wherein an aqueous etching solution is employed to remove portions of the metal surface of the plate in selected areas only, the steps comprising applying over the metal-surfaced plate a hydrophilic water-insoluble sub-layer non-reactive with and adherent to an after-applied coat of a light-sensitive system to hold in integral assembly such plate and after-applied coat while protecting the latter from direct contact with the metal plate, applying over the sub-layer such a coat comprising a water-soluble non-tanning ferric iron ammonium salt photochemically reducible by light to the ferrous state and a water-soluble organic film-forming resin susceptible to insolubilization by oxidation, such sub-layer being penetrable by the aqueous etching solution upon removal of such coat, exposing certain areas of the coat to light to reduce the iron of the ferric iron ammonium salt to a ferrous form, reacting an oxidizer with the oxidation-susceptible film-forming resin in the presence of a water-soluble polycarboxylic acid and such ferrous iron thereby to insolubilize on the sub-layer only those areas of the film-forming resin exposed to light, said acid promoting the insolubilizing reaction, removing the unexposed areas of the light-sensitive coat to uncover the corresponding underlying areas of the sub-layer, applying an aqueous etching solution for the metal of the plate to both the exposed areas and the unexposed and uncovered areas of the plate to penetrate and remove said sub-layer and etch the metal of said plate in said uncovered areas only, said exposed insolubilized areas preventing etching of the metal and removal of the sub-layer in said areas.

2. The method of claim 1 wherein the step of applying a sub-layer comprises applying a layer of gelatin.

3. The method of claim 1 wherein the step of applying a sub-layer comprises applying a layer of an acrylic compound selected from the group consisting of polyacrylic acid, polymethacrylic acid, the water-soluble salts of said acids, and polyacrylamide.

4. The method of claim 1 wherein the step of applying a sub-layer comprises applying a layer of a cellulosic material selected from the group consisting of carboxymethyl cellulose and carboxymethyl hydroxyethyl cellulose.

5. The method of claim 1 wherein the step of applying a sub-layer comprises applying a solution of a titanate and then drying, such titanate having the formula $R_4TiO_4$ wherein R is a hydrocarbon group having at least four carbon atoms and selected from the class consisting of alkyl and alkylene groups.

6. The method of claim 1 wherein the step of applying the sub-layer comprises applying a layer of an amine resin selected from the group consisting of amine modified urea-formaldehyde resins, alkali metal sulfurous acid salt modified urea-formaldehyde resins, alkylated methylol melamine resins, and melamine-formaldehydepolyalkylenepolyamine resins.

7. The method of claim 1 wherein the step of applying a sub-layer comprises applying a first stratum of an amine resin selected from the group consisting of an amine modified urea-formaldehyde resin, alkali metal sulfurous acid salt modified urea-formaldehyde resins, alkylated methylol melamine resins, and melamine-formaldehyde-polyalkylenepolyamine resins, applying a second stratum of a member selected from the group consisting of polycarboxy compounds, combined polyhydroxy-polycarboxy compounds, alkali metal silicates, and water-soluble fluo-silicates, and then interreacting the two strata to form a single sub-layer.

8. The method of claim 7 further including adding a third stratum of a water-soluble salt of a metal of Group IV–B of the Periodic Table, and then interreacting the three strata to form a single sub-layer.

9. The method of claim 1 wherein such water-soluble polycarboxylic acid of the light-sensitive system is selected from the group consisting of citric acid, oxalic acid, and tartaric acid.

10. The method of claim 1 wherein such water-soluble non-tanning ferric iron ammonium salt of the light-sensitive system is selected from the group consisting of ferric ammonium citrate, ferric ammonium oxalate, ferric ammonium tartrate, and such salts having a hydrogen of the ammonium group substituted by an alkyl group selected from the class consisting of methyl and ethyl.

11. The method of claim 1 wherein the water-soluble resin of such light-sensitive system is selected from the group consisting of gelatin, polyvinyl alcohol, polyvinyl methyl ether-maleic anhydride copolymer, and mixtures thereof.

12. The method of claim 1 wherein the metal of such sheet is selected from the group consisting of aluminum, zinc, copper, magnesium, and chromium.

13. The method of claim 1 wherein the metal of such sheet is zinc and further includes the step of treating the zinc sheet to form thereon a layer of zinc oxalate prior to applying such protective sub-layer.

14. A method of preparing a resist on a metal-surfaced sheet comprising the steps of applying over such metal surface an organic resinous water-insoluble water-attractive sub-layer non-reactive with and adherent to an after-applied coat of a light-sensitive system to hold in integral assembly such sheet and after-applied coat while protecting the latter from direct contact with the metal sheet, and then applying such a light-sensitive coat over the sub-layer consisting essentially of a water-soluble non-tanning ferric iron ammonium salt photochemically reducible by light to a ferrous form, and a water-soluble oxidizable organic film-forming resin capable of undergoing Fenton's reaction, exposing selected areas of the coat to light so to reduce the iron ammonium in the ferric iron salt to a ferrous form, reacting an oxidizer with the film-forming resin in the presence of a sufficient amount of a water-soluble polycarboxylic acid to provide a pH in the range of about 2 to about 4, thereby to insolubilize on the sub-layer only those areas of the film-forming resin exposed to light, and then removing the unexposed areas of the light-sensitive coat.

15. A method of preparing a deep etch lithographic plate comprising the steps of applying over a metal sheet a water-insoluble organic resinous sub-layer non-reactive with and adherent to an after-applied coat of a light-sensitive system to hold in integral assembly such sheet and after-applied coat while protecting the latter from direct contact with the metal sheet, such sub-layer being sufficiently water-attractive to form non-printing portions of a lithographic plate, and then applying such a light-sensitive coat over the sub-layer consisting essentially of a water-soluble non-tanning ferric iron ammonium salt photochemically reducible by light to a ferrous form, and a water-soluble oxidizable organic film-forming resin capable of undergoing Fenton's reaction, exposing selected areas so as to reduce the ferric iron of the ferric iron ammonium salt to a ferrous form, reacting an oxidizer with the film-forming resin in the presence of a non-polymeric water-soluble polycarboxylic acid, thereby to insolubilize on the sub-layer only those areas of the film-forming resin exposed to light, said acid promoting the insolubilizing reaction, then removing the unexposed areas of the light-sensitive coat to uncover the corresponding underlying areas of the sub-layer, penetrating such corresponding areas with an aqueous solution of an etchant for the metal of such sheet to remove such sub-layer and etch the same corresponding areas of the metal plate thereby to define printing portions of the plate, adhering an ink-receptive material to said printing portions, and then removing such light-exposed insolubilized areas of the film-forming resin to uncover underlying matching areas of the water-attractive sub-layer forming non-printing portions of the plate.

16. A method of preparing a resist on a metal surfaced sheet comprising the steps of applying over such metal surface a hydrophilic water-insoluble sub-layer which is non-reactive with and adherent to an after-applied coat of a light-sensitive system to hold in integral assembly such sheet and coat while protecting the latter from direct contact with said metal sheet, applying over said sub-layer a light-sensitive coat consisting essentially of a water-soluble non-tanning ferric iron ammonium salt photochemically reducible by light to a ferrous form and a water soluble oxidizable organic film forming resin capable of undergoing Fenton's reaction, exposing selected areas of said coat to light to reduce the iron in the ferric iron ammonium salt to a ferrous form, reacting an oxidizer with said film forming resin in the presence of a sufficient amount of a water soluble polycarboxylic acid to provide a pH in the range of about 2 to 4 to insolubilize upon said sub-layer only those areas of said film forming resin exposed to light, and removing the unexposed areas of the light-sensitive coat.

17. The method of claim 16 wherein the metal of said metal-surfaced sheet is chromium, and wherein said sub-layer is chromium oxide.

18. The method of claim 16 wherein the metal of said metal-surfaced sheet is zinc, and wherein said sub-layer is formed by treating said metal surface with an aqueous solution of a ferrocyanide selected from the group consisting of sodium, potassium, and ammonium ferrocyanides.

(References on following page)

References Cited in the file of this patent

UNITED STATES PATENTS

| | | |
|---|---|---|
| 1,042,827 | Schumacher | Oct. 29, 1912 |
| 1,265,464 | McCloskey | May 7, 1918 |
| 1,430,347 | Albert | Sept. 26, 1922 |
| 1,892,682 | Richards | Jan. 3, 1933 |
| 1,954,325 | Martinez | Apr. 10, 1934 |
| 2,154,506 | Hinman et al. | Apr. 18, 1939 |
| 2,495,661 | Scanlan | Jan. 24, 1950 |
| 2,681,310 | Wood | June 15, 1954 |
| 2,907,656 | Geese | Oct. 6, 1959 |
| 3,038,803 | Kosar | June 12, 1962 |
| 3,023,099 | Yeager et al. | Feb. 27, 1962 |

FOREIGN PATENTS

| | | |
|---|---|---|
| 449,772 | Great Britain | July 2, 1936 |
| 665,649 | Great Britain | Jan. 30, 1952 |
| 815,471 | Great Britain | June 24, 1959 |

OTHER REFERENCES

Chemistry of Lithography, Lithographic Technical Foundation, N.Y., 1952, pages 110–111 and 139.

Chemistry of Lithography, Lithographic Technical Foundation, N.Y., 1952, pages 102–105.